United States Patent
Lingala et al.

(10) Patent No.: US 11,435,419 B2
(45) Date of Patent: Sep. 6, 2022

(54) STREAK ARTIFACT REDUCTION IN MAGNETIC RESONANCE IMAGING

(71) Applicant: Siemens Healthcare GmbH, Erlangen (DE)

(72) Inventors: Sajan Goud Lingala, East Windsor, NJ (US); Boris Mailhe, Plainsboro, NJ (US); Nirmal Janardhanan, Monmouth Junction, NJ (US); Jyotipriya Das, Plainsboro, NJ (US); Robert Grimm, Nuremberg (DE); Marcel Dominik Nickel, Herzogenaurach (DE); Mariappan S. Nadar, Plainsboro, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 1079 days.

(21) Appl. No.: 15/976,260

(22) Filed: May 10, 2018

(65) Prior Publication Data
US 2019/0346518 A1    Nov. 14, 2019

(51) Int. Cl.
*G01R 33/34*    (2006.01)
*G06T 7/00*    (2017.01)
*G06T 11/00*    (2006.01)
*G06T 7/11*    (2017.01)

(52) U.S. Cl.
CPC ...... *G01R 33/34084* (2013.01); *G06T 7/0012* (2013.01); *G06T 7/11* (2017.01); *G06T 11/008* (2013.01); *G06T 2207/10096* (2013.01)

(58) Field of Classification Search
CPC .......... G01R 33/34084; G01R 33/4824; G01R 33/56572; G01R 33/56545; G01R 33/58; G06T 7/11; G06T 7/0012; G06T 11/008; G06T 2207/10096; A61B 5/055
See application file for complete search history.

(56) References Cited

FOREIGN PATENT DOCUMENTS

| | | |
|---|---|---|
| CN | 1573352 A | 2/2005 |
| CN | 1683939 A | 10/2005 |
| CN | 1954779 A | 5/2007 |
| CN | 1961826 A | 5/2007 |

(Continued)

OTHER PUBLICATIONS

Li Feng et al: "RACER-GRASP: Respiratory-weighted, aortic contrast enhancement-guided and coil-unstreaking golden-angle radial sparse MRI: Rapid, Continuous, and Clinically Robust DCE-MRI", Magnetic Resonance in Medicine., vol. 80, No. 1, Nov. 28, 2017 (Nov. 28, 2017), pp. 77-89.

(Continued)

*Primary Examiner* — Michael T Rozanski (57) ABSTRACT

For radial sampling in magnetic resonance imaging (MRI), a rescaling factor is determined from k-space data for each coil. The rescale factor is inversely proportional to the streak energy in the k-space data. The k-space data from the coils is rescaled for reconstruction, such as weighting the k-space data by the rescale factor in a data consistency term of iterative reconstruction. The rescale factor is additionally or alternatively used to determine a correction field for correction of intensity bias applied to intensities in the image-object space after reconstruction. These approaches may result in a diagnostically useful bias-corrected image with reduced streak artifact while benefiting from the efficient computation (i.e., computer operates to reconstruct more quickly).

15 Claims, 5 Drawing Sheets

(56) References Cited

FOREIGN PATENT DOCUMENTS

| | | | |
|---|---|---|---|
| CN | 101351721 | A | 1/2009 |
| CN | 101647698 | | 2/2010 |
| CN | 102402787 | A | 4/2012 |
| CN | 102612657 | A | 7/2012 |
| CN | 102928796 | A | 2/2013 |
| CN | 103099619 | A | 5/2013 |
| CN | 103163497 | A | 6/2013 |
| CN | 104181480 | A | 12/2014 |
| CN | 104739409 | A | 7/2015 |
| CN | 104793160 | A | 7/2015 |
| CN | 104835113 | A | 8/2015 |
| CN | 106443535 | A | 2/2017 |
| CN | 106574954 | A | 4/2017 |
| CN | 107920793 | A | 4/2018 |
| EP | 2138860 | A1 | 12/2009 |

OTHER PUBLICATIONS

Kholmovski EG, Parker DL, Di Bella EV: "Streak Artifact Suppression in Multi-coil MRI with Radial Sampling", International Society for Magnetic Resonance in Medicine, vol. 15, 1902, May 19, 2007, 1 page.

Feng, L., et al. Unstreaking: Radial MRI with Automatic Streaking Artifact Reduction, ISMRM 2017.

Block, Kai Tobias, et al. "Towards routine clinical use of radial stack-of-stars 3D gradient-echo sequences for reducing motion sensitivity." Journal of the Korean Society of Magnetic Resonance in Medicine 18.2 (2014): 87-106.

Grimm, Robert, et al. "Fast automatic coil selection for radial stack-of-stars GRE imaging." Proc Intl Soc Magn Reson Med. vol. 21. 2013.

Holme, H. Christian M., and Jens Frahm. "Sinogram-based coil selection for streak artifact reduction in undersampled radial real-time magnetic resonance imaging." Quantitative imaging in medicine and surgery 6.5 (2016): 552.

Johnson, Kevin M., et al. "Improved least squares MR image reconstruction using estimates of k-space data consistency." Magnetic resonance in medicine 67.6 (2012): 1600-1608.

Xue, Yiqun, et al. "Automatic coil selection for streak artifact reduction in radial MRI." Magnetic resonance in medicine 67.2 (2012): 470-476.

STREAK ARTIFACT REDUCTION IN MAGNETIC RESONANCE IMAGING

BACKGROUND

The present embodiments relate to magnetic resonance imaging (MRI). MRI spatial encoding using radial sampling may be valuable in time-resolved MRI, such as contrast enhanced imaging or dynamic imaging of moving structures. Radial sampling offers improved motion robustness, improved time acquisition efficiency, and provides incoherent alias patterns. However, streaking artifacts (i.e., artifacts due to under-sampling) degrade image quality degradation in radial sampling. While imaging a large field of view with multiple coil elements, a few coil elements contain significantly more streak artifact content compared to other coils. This occurs due to several reasons, such as gradient non-linearity effects (leading to strong signal accumulation in distant areas from the iso-center), off-resonance, and/or insufficient fat suppression. These streak artifacts may hamper the final diagnostic quality and interpretation of the reconstructed images.

The intensity of artifacts is different for different slices. To reduce streak artifact, the coil elements containing significant streak content may be disabled during reconstruction. However, these schemes require automated selection of unwanted coils for each slice or partition. An "unstreaking" approach has been proposed which weights each coil during reconstruction by a streak energy score and implicitly avoids selection/de-selection of coils. The streak score relies on image-space data, which requires performing a computationally expensive gridding step. An image intensity bias across the volume is introduced as different slices have different streak energy content.

SUMMARY

By way of introduction, the preferred embodiments described below include methods, systems, instructions, and computer readable media for magnetic resonance imaging. For radial sampling in MRI, a rescaling factor is determined from k-space data for each coil. The rescale factor is inversely proportional to the streak energy in the k-space data. The k-space data from the coils is rescaled for reconstruction, such as weighting the k-space data by the rescale factor in a data consistency term of iterative reconstruction. The rescale factor is additionally or alternatively used to determine a correction field for correction of intensity bias applied to intensities in the image-object space after reconstruction. These approaches may result in a diagnostically useful bias-corrected image with reduced streak artifact while benefiting from the efficient computation (i.e., computer operates to reconstruct more quickly).

In a first aspect, a method is provided for reducing streak artifact in a magnetic resonance imaging system. The magnetic resonance imaging system acquires k-space data for different coils from a radial scan of a patient. A streak energy is determined from the k-space data for each of the coils. The k-space data is weighted differently for different ones of the coils based on the respective streak energies. A representation of the patient is reconstructed from the weighted k-space data. An image is generated from the representation.

In a second aspect, a method is provided for reducing streak artifact in a magnetic resonance imaging system. The magnetic resonance imaging system acquires k-space data for different coils from a radial scan of a patient. A streak energy is determined from the k-space data for each of the coils. A correction field is calculated from the streak energy. A representation of the patient is reconstructed from the k-space data. After the reconstruction, the representation is corrected based on the correction field. An image is generated from the representation.

In a third aspect, a magnetic resonance system is provided for streak artifact reduction. A reconstruction processor is configured to determine rescale factors of streak energy for coils and reconstruct, from measures by the coils of a patient, a region of the patient. The rescale factors are included in a data-consistency check of the reconstruction. A display is configured to display an image of the region of the patient as reconstructed.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

Streak artifacts are reduced in iterative radial MRI. Simple computationally inexpensive steps are implemented prior to reconstruction. These pre-processing steps include evaluation of the streak score on the raw input multi-coil k-t space data. A streak energy metric directly in the k-t domain allows pre-processing relative to reconstruction. The streak energy metric may be a ratio of the L2 norm of the high frequency k-space content to the low frequency k-space content. A threshold dictates the separation of the low-frequency content and the high-frequency content. This threshold-based metric weights each coil in the multi-coil k-space data, therefore implicitly reducing the contribution of coil elements containing significant streak energy content.

The intensity bias introduced due to the re-scaling of each coil element is corrected. The correction occurs post reconstruction. The correction is robust to artificially introduced intensity bias.

As an extension, coil compression and streak artifact reduction may be combined into a single step. This approach uses the generalized singular value decomposition algorithm to estimate virtual coil subspaces, while encouraging a maximum separation between the low frequency and high frequency k-space regions. This would result in a set of virtual coils ranked according to the coil sensitivity variation as well as the amount of streak content within them. Like coil compression, the significant virtual coils and not the coils containing most of the streak artifact may be used subsequently for reconstruction.

Radial MRI is commonly used in several applications. These streak artifact reduction approaches may be used in any radial MRI scan. For example, iterative radial dynamic contrast enhanced MRI (DCE-MRI) of the liver using golden angle sampling and sparsity-based constrained reconstruction (GRASP) uses the streak artifact reduction. Streak artifacts from the arms fold over onto the liver in abdominal DCE-MRI exams and are a source of nuisance during interpretation of the data. This approach of reducing streaking in radial MRI directly improves the image quality and diagnostic interpretation from these sequences. Other use cases may benefit from streak artifact reduction, such as coronal and/or sagittal large field of view (FOV) imaging, where gradient non-linearities in the S/I direction are significant or such as other radial sequences (e.g., Siemens STAR-VIBE).

Figure 1:
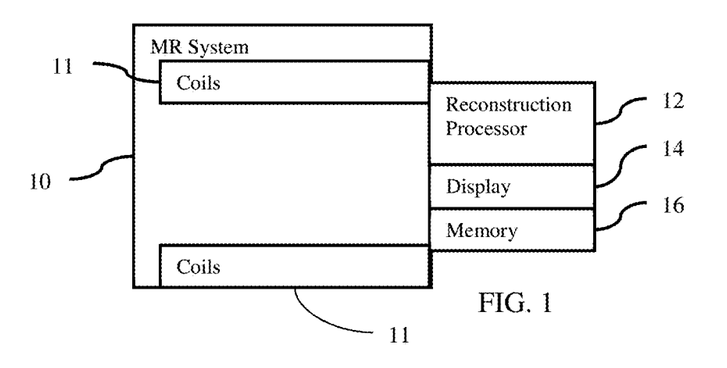
FIG. 1 is one embodiment of a magnetic resonance system for streak artifact reduction.

FIG. 1 shows a magnetic resonance imaging (MRI) system 10 for streak artifact reduction. The system implements the method of FIG. 2 or another method for reducing streaking artifact based on (1) streak energy determined from k-space data, (2) intensity bias correction based on streak energy, and/or (3) iterative reconstruction with rescaling based on streak energy.

Any now known or later developed MRI system for radial imaging may be used. The system 10 includes coils 11, a reconstruction processor 12, a display 14, and a memory 16. Additional, different, or fewer components may be provided. For example, a network or network connection is provided, such as for networking with a medical imaging network or data archival system. In another example, a user interface is provided. In yet another example, the reconstruction processor 12 is implemented as multiple devices, such as a pre-processor or detector for measuring k-space data from the coils 11 and a graphics processing unit or other device for performing reconstruction and/or a Fourier transform.

The reconstruction processor 12, memory 16, and display 14 are part of the medical imaging system 10. Alternatively, the reconstruction processor 12, memory 16, and/or display 14 are part of an archival and/or image processing system, such as associated with a medical records database workstation or server. In other embodiments, the reconstruction processor 12, memory 16, and/or display 14 are a computer, such as desktop or laptop, a workstation, a server, a network, or combinations thereof. The reconstruction processor 12, memory 16, and/or display 14 may be provided without other components for artifact reduction, such without the coils 11 where the k-space data is loaded from a memory or database.

The MR system 10 includes a main field magnet, such as a cryomagnet, and gradient coils. Other processing components may be provided, such as for planning and generating a sequence of transmit pulses for the coils 11 and for receiving and processing the received k-space data. The transmit pulses may be spatially controlled with gradient coils to perform a radial sampling of the patient.

The coils 11 are coils in a body coil and/or coils in local or surface coils. For example, in DCE-MRI imaging of the liver, a patient may have multiple (e.g., 30-42) surface coils positioned against their body within a bore of the MR system 10. These surface coils 11 receive signals from the patient in response to pulses transmitted from the body coil 11 and/or the surface coils 11. The coils 11 are antennas, such as wires or plates in looped or other shapes or arrangements. Any coil 11 for MRI may be used. Any number of coils 11 may be used for a given scan.

The reconstruction processor 12 is a general processor, central processing unit, control processor, graphics processor (e.g., graphics processing unit), digital signal processor, three-dimensional rendering processor, image processor, application specific integrated circuit, field programmable gate array, digital circuit, analog circuit, combinations thereof, or other now known or later developed devices for MR reconstruction. The reconstruction processor 12 is a single device or multiple devices operating in serial, parallel, or separately. The reconstruction processor 12 may be a main processor of a computer, such as a laptop or desktop computer, or may be a processor for handling some tasks in a larger system, such as in the MR system 10. The reconstruction processor 12 is configured by instructions, design, hardware, and/or software to perform the acts discussed herein, such as reconstruct MR regions representing a patient with streak artifact reduction from a radially sampled MRI scan.

The reconstruction processor 12 is configured to reconstruct a region (e.g., volume, plane, or slice) from measurements using the coils 11. The coils 11 provide measurements in k-space. By controlling the MR system 10 or by acquisition of data by transfer or loading, the reconstruction processor 12 receives k-space data. In general, by applying inverse Fourier processing to the k-space data, the spatial distribution of response from the patient is reconstructed. Since radial sampling may be sparse, an iterative reconstruction may be performed. The reconstructed data is a representation representing the patient region (e.g., volume or voxel regions distributed in three-dimensions). The representation is voxels or pixels representing a volume or plane.

Any reconstruction for radial sampling approach may be used. In one embodiment, the radially sampled data is gridded to a Cartesian grid and then reconstruction (e.g., inverse Fourier transform-based reconstruction) is performed. In another embodiment, GRASP or other radial reconstruction is performed without gridding. The reconstruction may be direct or iterative. For iterative reconstruction, the measured k-space data is fit to a model of the MR system. Iterative changes to the fit are performed to reconstruct.

The reconstruction provides the representation of a region of the patient at a given time or period. The reconstruction may provide a sequence of representations representing the patient over time. The reconstruction may output an image or sequence of images. Image may be used for scalar values representing the patient that may be then formatted or rendered to a display screen. Image may be used for display values (e.g., RGB) formatted for a display screen. By scanning the patient with sequences specific to the type of reconstruction, the reconstruction processor 12 is configured to reconstruct sets of data representing different aspects (e.g., structural, diffusion, and/or functional) of the patient.

The reconstruction is performed in a way to reduce streak artifacts from the radial or other sparse scan. For example, the reconstruction processor 12 is configured to determine rescale factors of streak energy for the coils. The rescale factor may be an inverse function of streak energy or another measure of level of streak. The streak energy is determined from k-space data for the coil 11 measuring the k-space data. The k-space data from each coil 11 is weighted by the rescale factor as part of iterative reconstruction, such as weighting the k-space data used to compare with the model of the MR system in a data-consistency check or term in the function for fitting. The reconstruction processor 12 is configured to reconstruct, from measures by the coils 11 of a patient, the region of the patient. Alternatively or additionally, the reconstruction processor 12 is configured to rescale coil sensitivity maps based on the rescale factor and/or to correct for intensity bias based on the rescale factor or differences in amount of streak. The reconstruction processor 12 may perform the reconstruction based on compressed k-space data. The relative streak energy content may be used in combination with compression so that the k-space data of the virtual coils used in reconstruction has less streak artifact.

The memory 16 is a graphics processing memory, a video random access memory, a random-access memory, system memory, random access memory, cache memory, hard drive, optical media, magnetic media, flash drive, buffer, database, combinations thereof, or other now known or later developed memory device for storing data or image information. The memory 16 is part of the MR system 10, part of a computer associated with the reconstruction processor 12, part of a database, part of another system, a picture archival memory, or a standalone device.

The memory 16 stores k-space data, streak energy by coil, rescale factor, rescaled k-space data, coil sensitivity maps, rescaled sensitivity maps, reconstructed representation, correction field, corrected data and/or other information used in generating an image from a radial MR scan. The memory 16 may store data during processing.

The memory 16 or other memory is alternatively or additionally a computer readable storage medium storing data representing instructions executable by the programmed processor 12 for reconstruction in MRI. The instructions for implementing the processes, methods and/or techniques discussed herein are provided on non-transitory computer-readable storage media or memories, such as a cache, buffer, RAM, removable media, hard drive or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone, or in combination. Likewise, processing strategies may include multiprocessing, multitasking, parallel processing, and the like.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

The display 14 is a monitor, LCD, projector, plasma display, CRT, printer, or other now known or later developed device for outputting visual information. The display 14 receives images, graphics, or other information from the reconstruction processor 12, memory 16, or MR system 10. One or more MR images of the region of the patient as reconstructed are displayed. Where a volume is reconstructed, the volume may be three-dimensionally rendered to an image for the two-dimensional display 14 or an image may be formed from a two-dimensional plane defined through the volume. Due to the streak artifact reduction, the image of the patient includes less streak artifact. Due to the intensity bias correction, intensity bias is removed or limited. Due to the determination of streak energy from k-space data, the rescaling for streak reduction may be more computationally efficient than determining streak energy from image or object space data or based on gridding.

Figure 2:
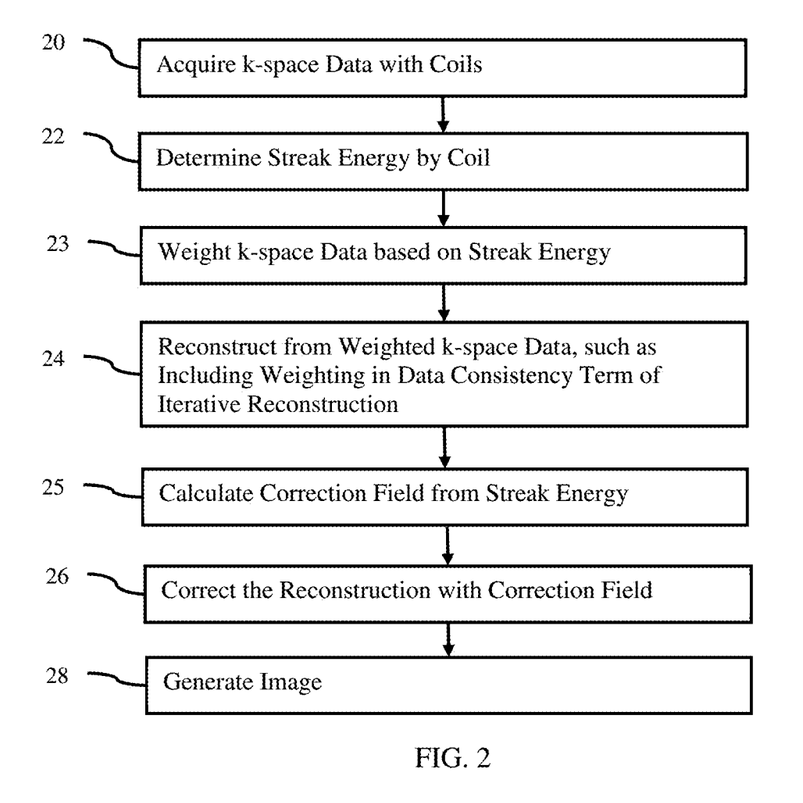
FIG. 2 is a flow chart diagram of one embodiment of a method for streak artifact reduction in magnetic resonance imaging.

FIG. 2 is a flow chart diagram of one embodiment of a method for reducing streak artifact in a MRI system. A data driven approach is used to reduce streaking artifacts in iterative radial MRI. Coil rescale factors inversely proportional to the streak energy in the coils are determined from k-space data without gridding. The re-scale factors may be included in and during the reconstruction as a weighting in data-consistency. The intensity bias introduced by rescaling of the coil elements is corrected in the reconstructed image-object domain post reconstruction.

The methods are implemented by the system of FIG. 1 or another system. For example, the methods are implemented on a computer or processor associated with a MRI system or PACS. The magnetic resonance system, using coils connected with transmitters and receivers, acquires the k-space data by scanning a patient. The magnetic resonance system, using a reconstruction and/or other image processor, determines streak energy, weights k-space data, reconstructs, calculates a correction field, and/or corrects the reconstructed representation of the patient region. The magnetic resonance system, using the reconstruction or other processor and the display generates an image from the reconstruction. The image has less streak artifact. Other distributions of functions among components may be used.

The acts are performed in the order shown (e.g., numerical or top-to-bottom) or other orders. For example, act 23 is performed as part of act 24. As another example, act 25 may be performed prior to act 24 or act 23.

The acts are performed with the patient in the MRI system, such as laying in a generally uniform main magnetic field. Alternatively, the acts directly relying on scanning the patient are performed with the patient in the MRI system, but other acts are performed with the patient out of the MRI system.

Additional, different, or fewer acts may be provided. For example, the correction field related acts 25 and 26 are not performed. As another example, other acts for reconstruction, configuration, use of results, or other operation of the pipeline are provided. In yet another example, other preprocessing is provided.

In act 20, the magnetic resonance imaging system acquires k-space data. One or more scans are performed by the magnetic resonance system. A sequence of pulses may be transmitted from one or more coils in a generally uniform main magnetic field while sampling is controlled by gradient coils. In response to application of magnetic fields and one or more pulses, data representing an interior region of a patient is acquired. By transmitting from and/or receiving signals at any of the MRI coils, k-space data is acquired. For example, the k-space data is acquired using a time-interleaved, multi-coil dynamic imaging sequence of pulses. As another example, the k-space data is acquired as frames or shot divisions of k-space data. K-space data is acquired for each of a plurality of different coils.

The transmit sequence and measurements are for a radial sequence. Any radial sequence may be used, such as GRASP. Any now known or later developed MR scan sequence may be used. For example, the k-space data is acquired as part of a dynamic contrast enhanced magnetic resonance imaging scan, other dynamic scan, other scan for patients or regions with motion, or another sparse scan pattern.

The k-space data as measured forms datasets for each coil over time (i.e., k-t data). Pre-processing may be applied to the k-space data. For example, for each of the k-space datasets, decoupling is performed to facilitate slice-by-slice processing. An inverse fast Fourier transform (IFFT) is applied along one dimension (e.g., z dimension), collapsing the k-space representation to two dimensions. Zero filling in the kz dimension to account for partial Fourier factor is followed by an IFFT along kz. In other embodiments, decoupling is not performed or is performed in a different way.

Figure 3:
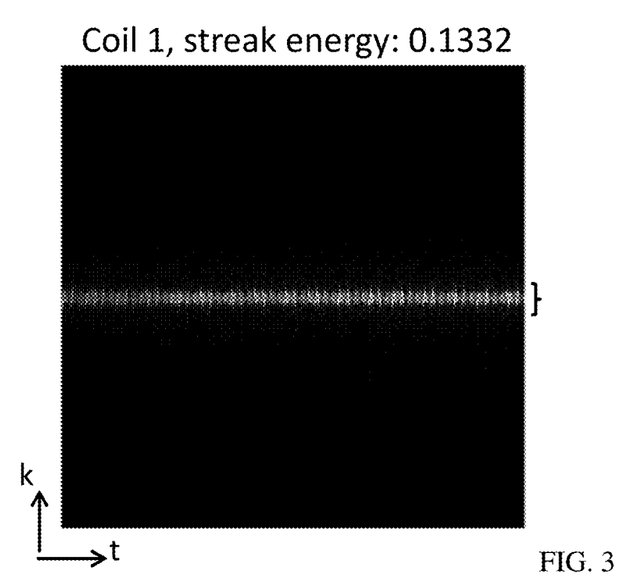
FIGS. 3 and 4 illustrate example k-space data for two different coils with different streak energy content.
Figure 4:
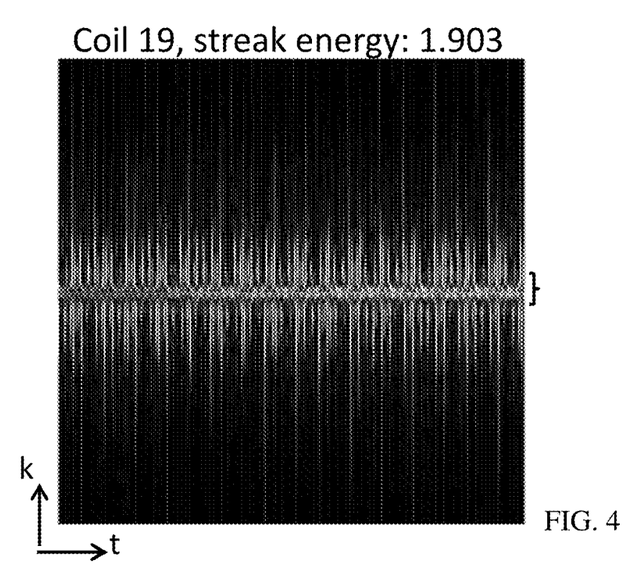

In act 22, an image, reconstruction, or other processor determines a streak energy from the k-space data for each of the coils. A streak energy is determined for each coil from the k-space data for that coil. FIGS. 3 and 4 show example k-space datasets for two coils from a 42-coil radial scan using DCE-MRI. The k-space data is shown over time in each of the datasets.

To determine the streak energy for a coil, the k-space data for that coil is separated into different frequency bands. For example, the k-space data is separated into high and low frequencies.

A threshold is assigned to separate, but another process may be used. The threshold defines a range of k-space region. For example, the k-space data has a dynamic range of 512. The center of the dynamic range is the lowest frequency. The threshold defines a k-space bin above and below the center, between which the low frequency k-space data is located and beyond which the high frequency k-space data is located. The threshold may be any level, such as the center 30 bins of the 512 bins. FIGS. 3 and 4 show a bracket on the right corresponding to the threshold at 30 bins of the 512 bins. The range may be any percentage of the total greater than 0% and less than 100%. In one embodiment, the range is between 2-15%, such as 6% or 10% of the total bins being allocated to the low frequency. The range may be shifted from the center.

The frequency separation of the k-space data provides one free parameter for evaluating the streak energy metric. Any measure of streak energy may be used. In one embodiment, a ratio of energy (i.e., k) of the high to the low frequencies is used. For example, the streak energy is the ratio of an L2 norm of the energy of the high frequency for decoupled k-space data to the L2 norm of the energy of the low frequency for decoupled k-space data. This is represented by $$\text{streak energy} = \frac{\|h\|_2}{\|l\|_2}$$

where h is the energy of the high frequency k-space data, l is the energy of the low frequency k-space data, and the subscript 2 represents the L2 norm. Other functions may be used, such as a difference. Variance or other indicators of a level of streak in the k-space data may be used.

The k-space data, correction field, and/or coil sensitivity maps are to be rescaled based on the streak energy or other streak level. Where a multiplicative weighting is used to rescale, the inverse of the streak energy is used, such as represented by $$\text{rescale factor} = \frac{1}{\text{streak energy}}.$$

Other functions may be used, such as dividing by the streak energy as the weighting or mapping the streak energy to a weight in a look-up table. Linear or non-linear relationships between the streak energy and the rescale factor may be used.

Figure 5:
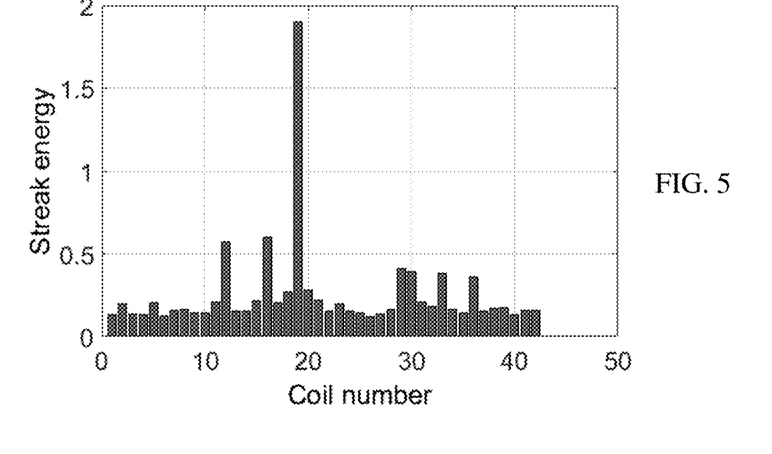
FIG. 5 illustrates example of the streak energy by coil.
Figure 6:
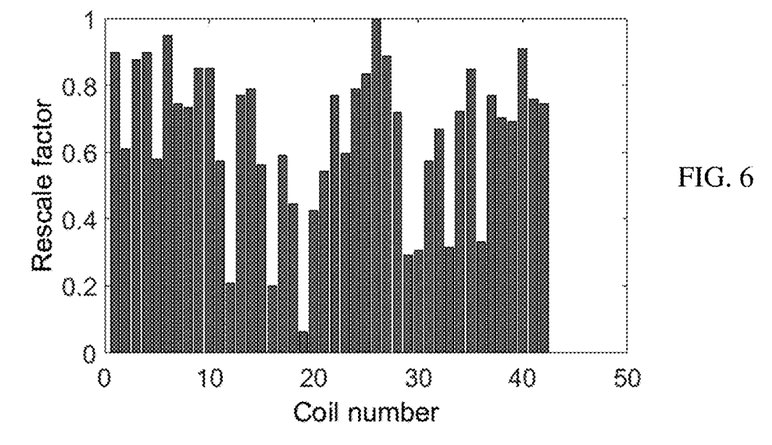
FIG. 6 illustrates example rescale factor by coil.

A rescale factor is determined for each of the coils. The rescale factors may be normalized across the coils, such as normalizing from 0 to 1. FIG. 5 shows example streak energy for each of 42 coils. FIG. 6 shows the corresponding example rescale factor for each of the coils. The k-space data for coil 1 of FIG. 3 and the k-space data for coil 19 of FIG. 4 are used in these examples of FIGS. 5 and 6 for coils 1 and 19. As shown, the k-space data of coil 1 has very little streak energy, so the rescale factor is large or close to 1 (e.g., about 0.9). The k-space data for coil 19 has a greater amount of streak energy, so the rescale factor is smaller (e.g., about 0.1).

In act 23, the image, reconstruction, or other processor weights the k-space data differently for different ones of the coils. The streak energy metric is used to weight the k-space data. For example, the k-space data is multiplied by the rescale factor. The k-space data for each coil is rescaled by the respective rescale factor (e.g., normalized inverse of the streak energy) for each coil. For example, the k-space data of coil 1 represented in FIG. 3 is weighted by the 0.9 rescale factor of FIG. 6, and the k-space data of coil 19 represented in FIG. 4 is weighted by the 0.1 rescale factor represented in FIG. 6. K-space data of other coils are weighted by the corresponding rescale factors for those coils, which may have the same or different values. Other weighting may be used, such as division by the streak energy and/or an offset based on the streak energy.

In one embodiment, the weighting occurs as part of compression. The compression and streak artifact reduction are combined. The k-space data from the coils is compressed to a fewer number of virtual coils. Any compression may be used, such as generalized singular value decomposition. By considering the low and high frequency k-space data (e.g., k-t) in the compression, the streak artifact information may be compressed to a few of the virtual coils. In one example, the compression is represented by $(H^H H)V=(L^H L)VD$ where H is the high frequency data, L is the low frequency data, the superscript H is the complex conjugate, V are the singular vectors of the virtual coils, and D are the singular values in the compression. The result is reducing the k-space data of the many coils (e.g., 42) to a fewer number of virtual coils (e.g., 8). By including the high and low frequency k-space data separately in the compression, the set of virtual coils is ranked according to the coil sensitivity variation as well as the amount of streak content within them. The significant virtual coils in V are used in subsequent reconstruction. The virtual coils associated with most of the streak artifact are not used in the reconstruction. The significant virtual coils are used, and the streak-related virtual coils are not used as the weighted k-space data in reconstruction.

In act 24, the reconstruction processor reconstructs a representation of the patient from the weighted k-space data. The representation is a two- or three-dimensional representation, such as voxels, pixels or scalar values in an image or object space. The weighted k-space data or k-space data is reconstructed into a spatial domain.

Any reconstruction may be used, such as a radial reconstruction. The k-space or weighted k-space data may be gridded, and reconstruction performed from the gridded data. In one embodiment, an iterative reconstruction is performed. The iterative reconstruction fits a forward model with the weighted k-space data. The weighted k-space data is in a data-consistency term of the iterative reconstruction. The fitting is repeated to minimize differences between the measured, weighted k-space data and the forward model of the MRI system. The forward model may include coil sensitivity maps estimated from a pre-scan or a time collapsed data of the weighted k-space data (e.g. radial average over time).

One example of introducing the weighting in the data-consistency term is represented by:

$$\min_f \|A(f) - b_j\|_2^2 + \lambda \|\psi(f)\|_1$$

where $b_j$ is the weighted k-space data for each coil j, f is the image or object space estimates being reconstructed, A is the forward model including the coil sensitivity maps, $\lambda$ is the L1 norm, and $\psi(f)$ is a wavelet transform. The data consistency term of the reconstruction uses or includes the weighted k-space data in each iteration to solve for the final image.

In one embodiment, the reconstruction is GRASP reconstruction. A retrospectively defined temporal resolution of 21 rays per frame is used for reconstruction with first order spatio-temporal wavelets and second order wavelets. A temporal scale of 200 times the spatial scale is used. Coil sensitivity estimation is by an eigen decomposition approach from time collapsed data. Since bias correction of act 26 is performed after reconstruction, bias correction is not performed as part of the reconstruction. Other temporal resolutions, scales, coil sensitivity determinations, wavelet approaches, and/or decompositions may be used.

The coil sensitivity maps may be rescaled instead of or in addition to the k-space data. The streak energies are used to rescale the coil sensitivity maps. In one embodiment, the coil sensitivity map as rescaled is given by:

$$csm\text{-rescaled} = \alpha_i csm_i / \sqrt{\Sigma |\alpha_i csm_i|^2}$$

where csm is the coil sensitivity map and $\alpha_i$ is the rescale factors from the streak energy. The coil sensitivity map for each coil is rescaled. Other scaling functions may be used.

In act 25, the image, reconstruction, or other processor calculates a correction field. The correction field is calculated from the streak energy. A bias in the spatial intensity variation is introduced due to re-scaling the coil elements. The bias correction field accounts for the rescaling for streak reduction. The bias correction field may also account for other biases, such as surface coil variation and/or coil compression.

In another embodiment, the correction field is a ratio of an inverse non-uniform fast Fourier transform from the k-space data without the weighting to an inverse non-uniform fast Fourier transform from the weighted k-space data. The transform is applied to the decoupled or time collapsed k-space and weighted k-space data. Before calculating the ratio, the transformed data may be low pass filtered.

In yet another embodiment, the correction field is calculated as a function of the coil sensitivity map and the streak energy. If coil sensitivity maps are known (e.g., from pre-scans or from a dedicated coil sensitivity map estimation algorithm), the maps may be used to determine the correction. For example, the correction field is calculated as:

$$\text{correction field} = 1 / \sqrt{\Sigma |\alpha_i csm_i|^2}$$

Other functions may be used.

In act 26, the image, reconstruction, or other processor corrects the reconstructed representation. The correction field is applied. Based on spatial location in the object or image space, the intensities or scalar values of the reconstructed representation (i.e., the final output reconstructed object) are altered. After the reconstruction is finished, the bias correction is applied as an intensity correction. A weighting or multiplication is used, but division or other functions may be used for correcting.

The streak energy from the k-space data may be used for rescaling the k-space data and/or coil sensitivity maps. The weighted k-space and/or the streak energy may be used to calculate a bias correction field. The weighted k-space data may be used for streak artifact reduction as part of iterative reconstruction. Compression may be combined with the streak artifact reduction to weight the k-space data to be used for reconstruction. Any of these approaches may be used alone. Various combinations may be used.

Figure 7:
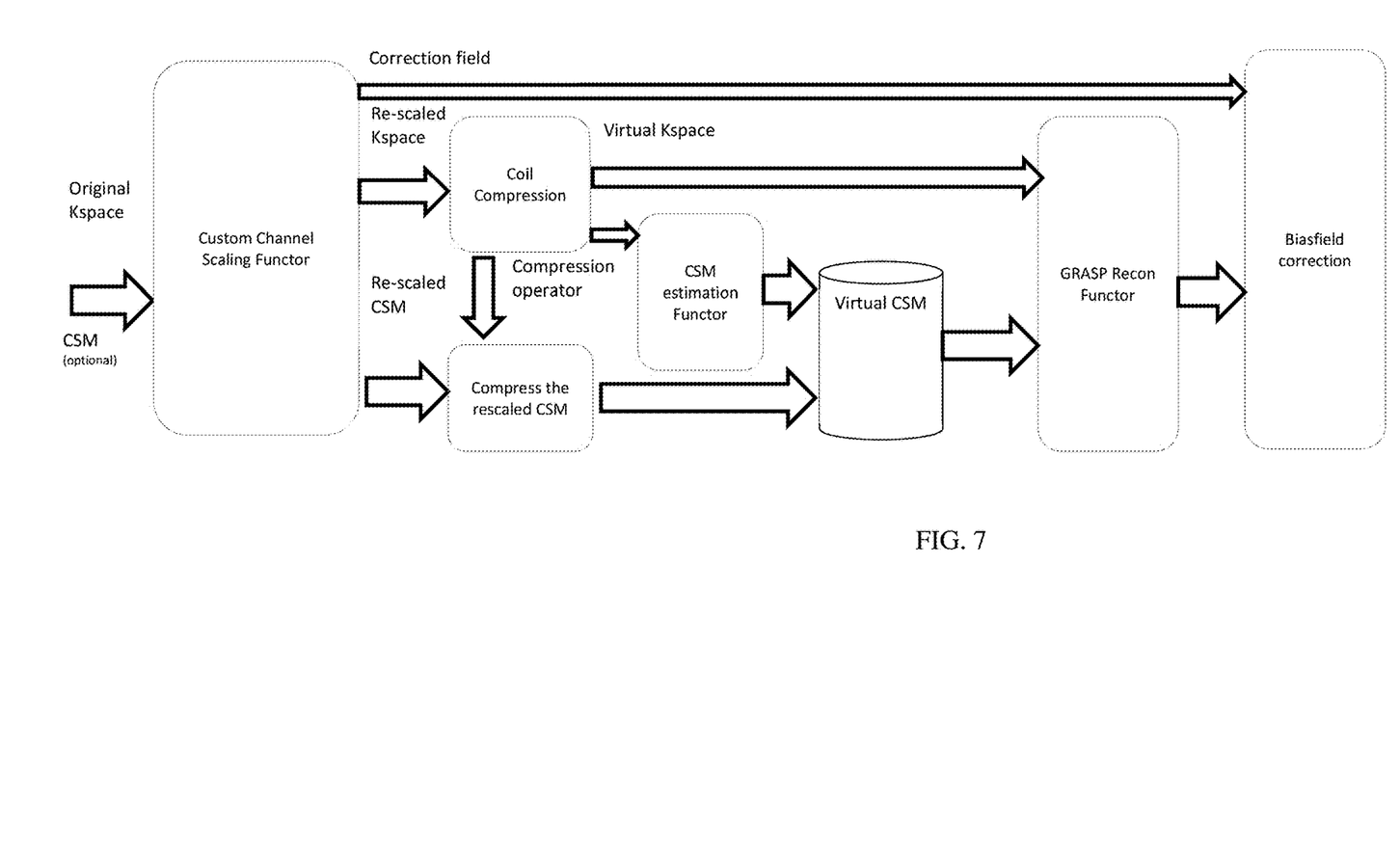
FIG. 7 shows one example pipeline for magnetic resonance imaging with streak artifact reduction.

FIG. 7 shows an example combination. The original k-space data and coil sensitivities, if known, are input. The scaling factor is determined from the streak energy of the k-space data. The correction field, the rescaled k-space, and rescaled coil sensitivity map are created from the scaling factor. Coil compression may be performed for the rescaled k-space data and the rescaled coil sensitivity maps. The rescaling of the k-space data may occur as part of the compression in other embodiments. If the coil sensitivity maps are not available (e.g., from pre-scans), a coil sensitivity estimator function is used to estimate the coil maps directly from the virtual compressed k-space data . . . . The reconstruction is performed using the virtual coil sensitivity map and the virtual k-space data (e.g., k-space data for selected virtual coils with limited streak artifacts). The output reconstructed image object is corrected for intensity bias. The result is an image object with less streak artifact and reduced intensity variation due to the rescaling. Since the streak energy is determined efficiently by the processor by being based on the k-space data from the radial scan without having to perform a computationally expensive gridding, the determination may be more efficient as implemented by the reconstruction processor.

In act 28, the reconstruction, image, or other processor generates an image from the representation. The image is a two-dimensional image or a three-dimensional rendering to a two-dimensional display from voxel data representing three-dimensions. The image is generated from a spatial distribution of intensities from the reconstruction. A sequence of images may be generated, such a representing the patient over time.

The image is transmitted. The transmission is to a display, to a memory, or over a network to another device. For example, the image is displayed on a display of an MRI system. Alternatively, the image is displayed on a workstation, computer or other device. The image may be stored in and recalled from a PACS memory.

Figure 8A:
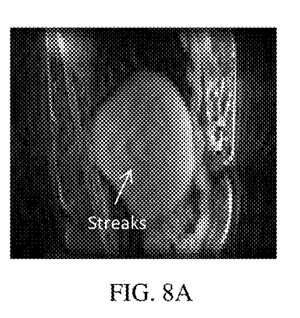
FIGS. 8A-C show example sagittal views of a liver with GRASP reconstruction without rescaling, GRASP reconstruction with rescaling, and GRASP reconstruction with rescaling and intensity bias correction, respectively.
Figure 8B:
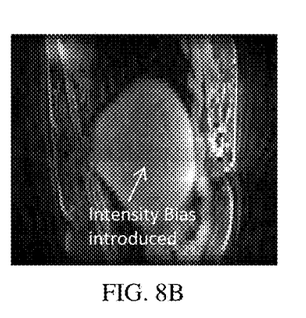
Figure 8C:
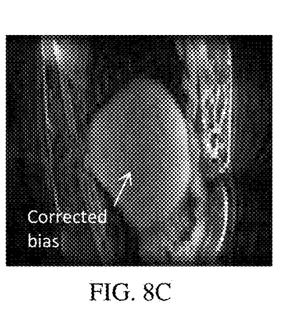

The image is diagnostically useful by reducing streak artifact and bias due to rescaling. FIGS. 8A-8C show an example. FIGS. 8A-C are sagittal images of a same liver from a same scan. In FIG. 8A, GRASP reconstruction is used from a DCE-MRI radial scan. Streaks appear as curved lines of different intensity in the image, making diagnosis more difficult. FIG. 8B shows the same reconstruction but using k-space-based streak energy to rescale the k-space data as used in the iterative reconstruction. The streak artifacts are reduced, but a horizontal intensity bias results. FIG. 8C shows the image resulting from bias correcting using the coil sensitivity map-based correction field. The bias is reduced, providing an image without false information from the streak artifact or bias from rescaling.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A method for reducing streak artifact in a magnetic resonance imaging system, the method comprising:
   acquiring, by the magnetic resonance imaging system, k-space data for different coils from a radial scan of a patient;
   determining a streak energy from the k-space data for each of the coils, the streak energy determined in the k-space domain;
   weighting the k-space data differently for different ones of the coils based on the respective streak energies;
   reconstructing a representation of the patient from the weighted k-space data; and
   generating an image from the representation.

2. The method of claim 1 wherein acquiring comprises acquiring as a dynamic contrast enhanced magnetic resonance imaging scan as the radial scan.

3. The method of claim 1 wherein determining comprises separating the k-space data into different frequency bands.

4. The method of claim 3 wherein separating comprises separating into high and low frequencies, the streak energy being a ratio of energy in the high frequency to energy in the low frequency.

5. The method of claim 3 wherein separating comprises separating by a frequency threshold.

6. The method of claim 1 wherein weighting comprises weighting with an inverse of the streak energy, the inverse being normalized.

7. The method of claim 1 wherein reconstructing comprises iteratively reconstructing with the weighted k-space data being in a data-consistency term of the iterative reconstruction.

8. The method of claim 7 wherein iteratively reconstructing comprises golden angle radial sparsity reconstruction.

9. The method of claim 1 further comprising:
   calculating a correction field; and
   correcting, after the reconstruction, the representation based on the correction field.

10. The method of claim 9 wherein calculating the correction field comprises calculating as a ratio of an inverse non-uniform fast Fourier transform from the k-space data without the weighting to an inverse non-uniform fast Fourier transform from the weighted k-space data.

11. The method of claim 9 wherein calculating the correction field comprises calculating the correction field as a function of a coil sensitivity map and the streak energy.

12. The method of claim 1 wherein weighting comprises compressing the k-space data for the different coils to a fewer number of virtual coils, the compressing including separate terms for high and low frequency components of the k-space data.

13. The method of claim 12 wherein weighting further comprises using less than all the virtual coils as the weighted k-space data, the virtual coils with more of the streak artifact not being used as the weighted k-space data.

14. The method of claim 1 wherein reconstructing comprises reconstructing with coil sensitivity maps rescaled as a function of the streak energy.

15. A magnetic resonance system for streak artifact reduction, the magnetic resonance system comprising:
   a plurality of coils;
   a reconstruction processor configured to determine rescale factors of streak energy for the coils determined in the k-space domain and reconstruct, from measures by the coils of a patient, a region of the patient, the rescale factors included in a data-consistency check of the reconstruction; and
   a display configured to display an image of the region of the patient as reconstructed.

* * * * *